(12) United States Patent
Wu et al.

(10) Patent No.: US 11,953,954 B2
(45) Date of Patent: Apr. 9, 2024

(54) VARIABLE HOLDER MODULE FOR SECURING EXPANSION CARDS

(71) Applicant: Dell Products L.P., Round Rock, TX (US)

(72) Inventors: Jing-Tang Wu, New Taipei (TW); Tung-Yi Chen, New Taipei (TW); Andrew O. Ingalls, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 77 days.

(21) Appl. No.: 17/858,577

(22) Filed: Jul. 6, 2022

(65) Prior Publication Data

US 2024/0012455 A1    Jan. 11, 2024

(51) Int. Cl.
| | |
|---|---|
| *G06F 1/16* | (2006.01) |
| *G06F 1/18* | (2006.01) |
| *H05K 5/00* | (2006.01) |
| *H05K 5/02* | (2006.01) |
| *H05K 7/00* | (2006.01) |
| *H05K 7/14* | (2006.01) |

(52) U.S. Cl.
CPC ............ *G06F 1/185* (2013.01); *H05K 5/0291* (2013.01); *H05K 7/1405* (2013.01); *H05K 7/1417* (2013.01)

(58) Field of Classification Search
CPC .......... G06F 1/185; G06F 1/186; G06F 1/183; G06F 1/181; H05K 5/0291; H05K 5/0295; H05K 5/0286; H05K 7/1405; H05K 7/1417; H05K 7/1402; H05K 7/1401; H05K 7/1418
See application file for complete search history.

(56) References Cited

U.S. PATENT DOCUMENTS

| | | | | |
|---|---|---|---|---|
| 6,466,448 | B1 * | 10/2002 | Baik | G06F 1/183 |
| | | | | 361/752 |
| 6,515,867 | B2 * | 2/2003 | Sheng-Hsiung | H05K 7/1429 |
| | | | | 248/225.11 |
| 7,596,001 | B2 * | 9/2009 | Tang | G06F 1/186 |
| | | | | 361/801 |
| 8,289,690 | B2 * | 10/2012 | Chang | G06F 1/186 |
| | | | | 361/752 |
| 2006/0174085 | A1 | 8/2006 | Wu et al. | |
| 2010/0153608 | A1 * | 6/2010 | Olesiewicz | H05K 7/1487 |
| | | | | 710/303 |
| 2014/0340834 | A1 | 11/2014 | Lee et al. | |
| 2017/0344078 | A1 * | 11/2017 | Abdul-Razzak | G06F 1/20 |
| 2022/0272858 | A1 * | 8/2022 | Lee | H05K 7/1408 |

* cited by examiner

*Primary Examiner* — Anthony M Haughton
(74) *Attorney, Agent, or Firm* — Larson Newman, LLP

(57) ABSTRACT

A variable holder module secures a variety of different expansion cards that may be installed within a computer or other information handling system. The holder module has a multi-sided component that is orientable according to which expansion card is to be secured within the computer. Each side of the component may thus correspond to a different one of the expansion cards. Once the expansion card is determined, a human or robotic picker need only orient component to the side that corresponds to the make/model of the expansion card. The holder module is thus adaptable to secure many different expansion cards that may be installed within the computer.

19 Claims, 21 Drawing Sheets

VARIABLE HOLDER MODULE FOR SECURING EXPANSION CARDS

FIELD OF THE DISCLOSURE

This disclosure generally relates to information handling systems, and more particularly relates to securement of expansion cards.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A holder module secures a variety of different expansion cards that may be installed within a computer or other information handling system. The holder module has a multi-sided component that is orientable according to which expansion card is to be secured within the computer. Each side of the component may thus correspond to a different one of the expansion cards. Once the expansion card is determined, a human or robotic picker need only orient component to the side that corresponds to the make/model of the expansion card. The holder module is thus adaptable to secure many different expansion cards that may be installed within the computer

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
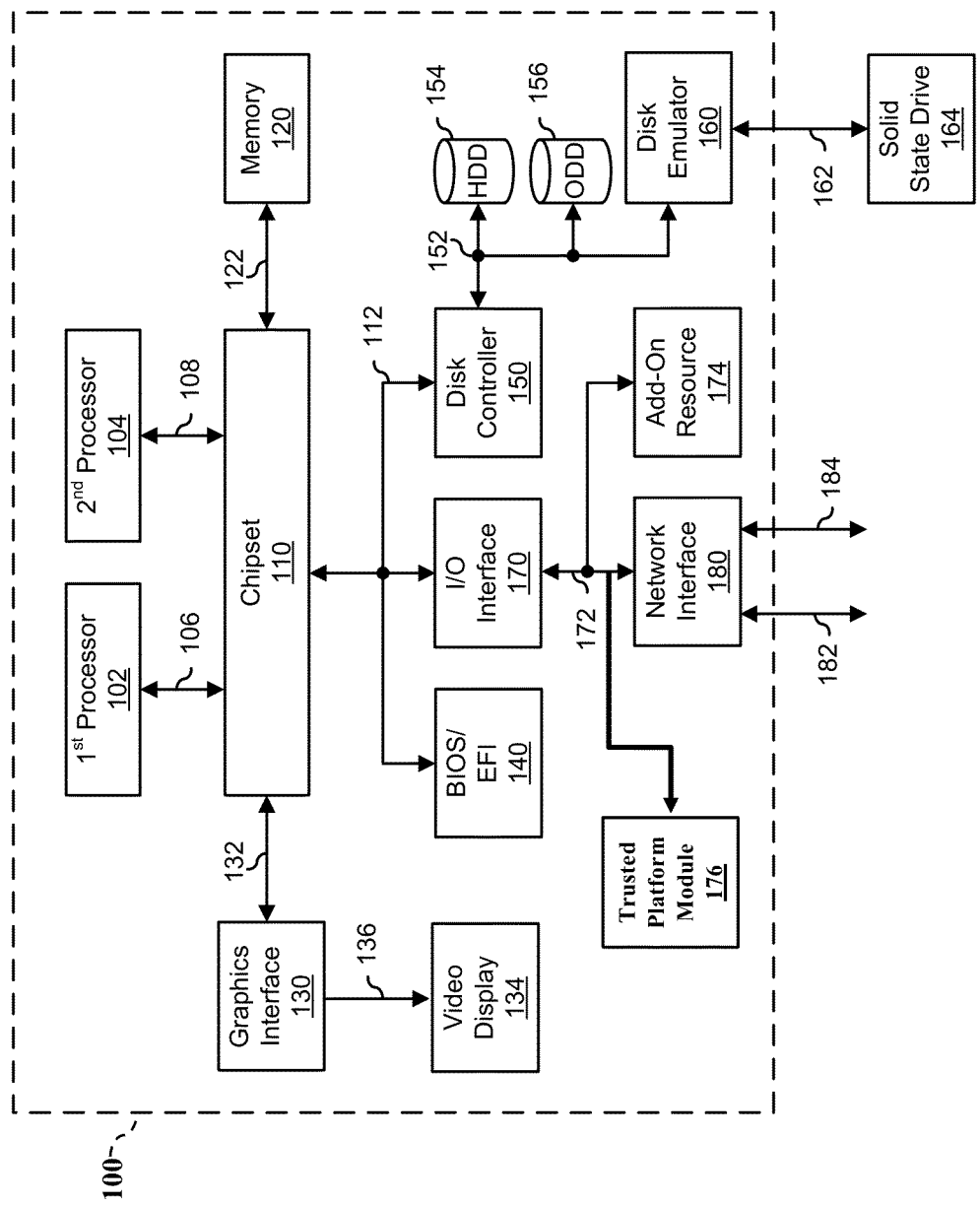
FIG. 1 illustrates an information handling system incorporating an intelligent imaging device, according to exemplary embodiments.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, and a network interface device 180. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

The information handling system 100 may include a baseboard management controller (BMC). The BMC is connected to multiple elements of information handling system 100 via one or more management interface to provide out of band monitoring, maintenance, and control of the elements of the information handling system. As such, BMC represents a processing device different from processors 102 and 104, which provides various management functions for information handling system 100. In an embodiment, BMC may be responsible for granting access to a remote management system that may establish control of the elements to implement power management, cooling management, storage management, and the like. The BMC may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface that may include an inter-integrated circuit ($I^2C$) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC includes a network interface that can be connected to a remote management system to receive firmware updates, as needed or desired. Here BMC receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC utilizes various protocols and application programming interfaces (APIs) to direct and control the processes for monitoring and maintaining the system firmware. An example of a protocol or API for monitoring and maintaining the system firmware includes a graphical user interface (GUI) associated with BMC, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RACADM) utility, Dell EMC Open Manage Server Administrator (OMSA) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC is included on a main circuit board (such as a baseboard, a motherboard, or any combination thereof) of information handling system 100, or is integrated into another element of the information handling system such as chipset 110, or another suitable element, as needed or desired. As such, BMC can be part of an integrated circuit or a chip set within information handling system 100. BMC may operate on a separate power plane from other resources in information handling system 100. Thus BMC can communicate with the remote management system via network interface or the BMC can communicate with the external mobile device using its own transceiver circuitry while the resources or elements of information handling system 100 are powered off or at least in low power mode. Here, information can be sent from the remote management system or external mobile device to BMC and the information can be stored in a RAM or NV-RAM associated with the BMC. Information stored in the RAM may be lost after power-down of the power plane for BMC, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Figure 2:
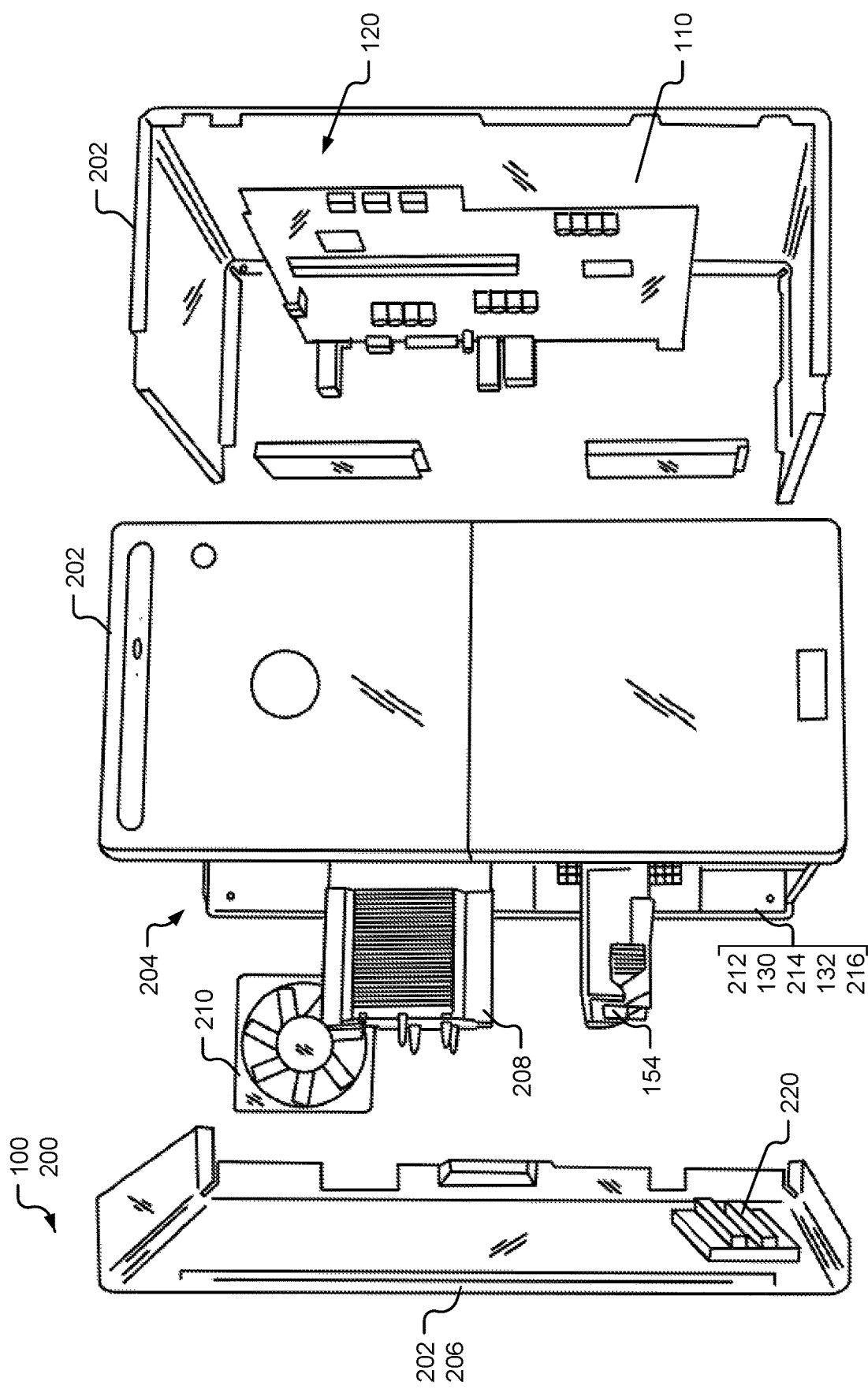
FIG. 2 is an exploded view of the information handling system, according to exemplary embodiments.

FIG. 2 is an exploded view of the information handling system 100, according to exemplary embodiments. The information handling system 100 is illustrated as a desktop computer 200, which most readers are thought familiar. The information handling system 100, however, may also be embodied as a smart cellular telephone, a laptop computer, a tablet computer, or any other processor-controlled device. The desktop computer 200 has an outer enclosure 202 and an inner chassis 204. The outer enclosure 202 disassembles to reveal the internal components (as illustrated in FIG. 1) of the desktop computer 200. A side cover 206, for example, may be removed to expose the memory drive 154, a power supply 208, and a cooling fan 210 mounted to the chassis 204. Further disassembly reveals the chipset 110 and the memory device(s) 120. When the side cover 206 is removed, various expansion cards 212 are also exposed. The expansion cards 212 physically interface with a motherboard (such as the chipset 110) via a physical connection. As a common example, the side cover 206 reveals the graphics adapter 130 (such as a graphics card 214). The graphics card 214 interfaces with the chipset 110 via the graphics interface 132 (such as a peripheral component interconnect-express interface or "PCIe" 216). The graphics card 214 also mechanically interfaces with a holder module 220 at the side cover 206. The holder module 220 has features and components that mechanically secure an edge or other portion of the expansion cards 212 (such as the graphics card 214). The outer enclosure 202 houses and protects the inner components of the desktop computer 200.

Figure 3:
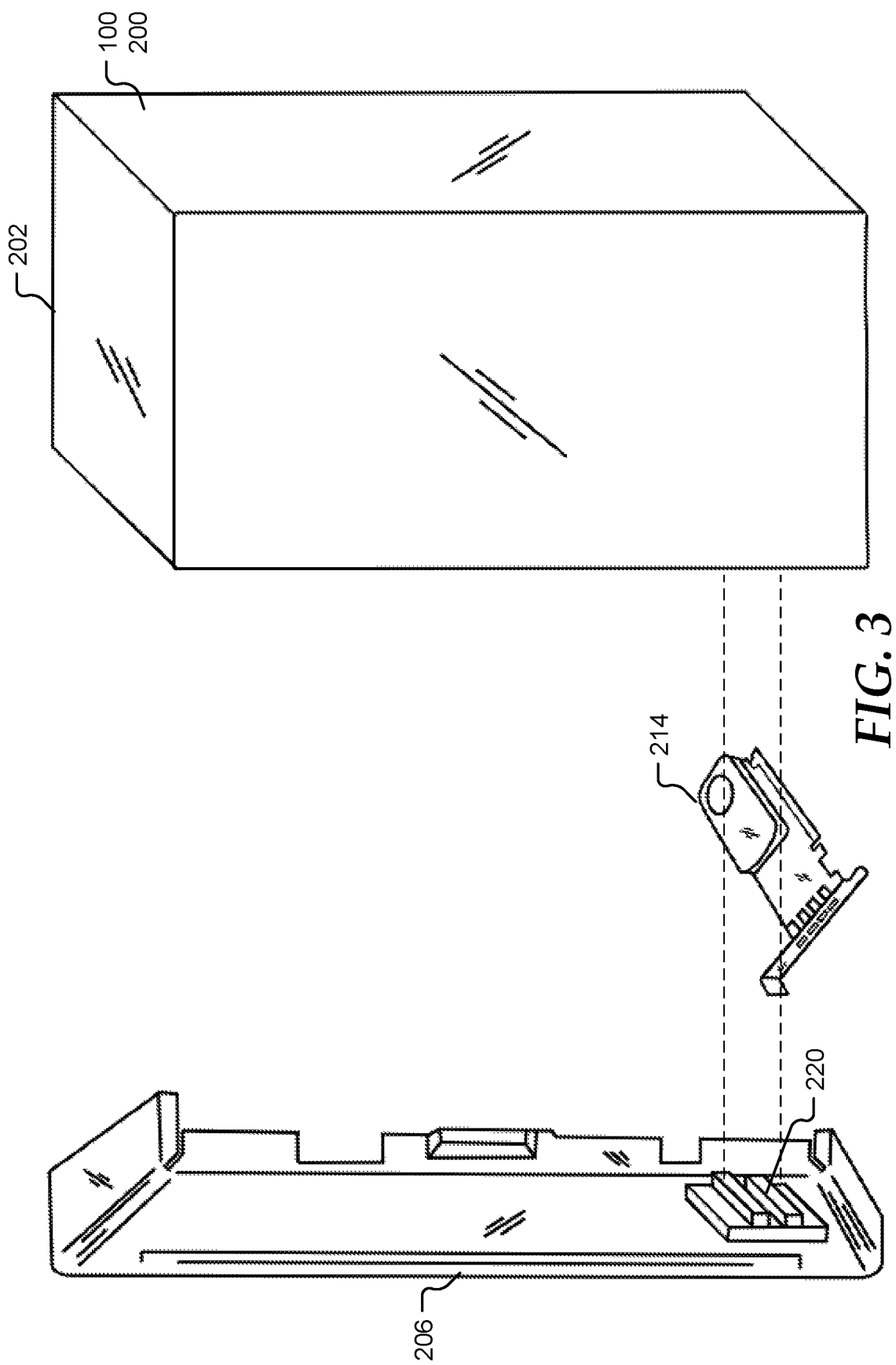
FIGS. 3-5 illustrate alignments of a holder module, according to exemplary embodiments.
Figure 4:
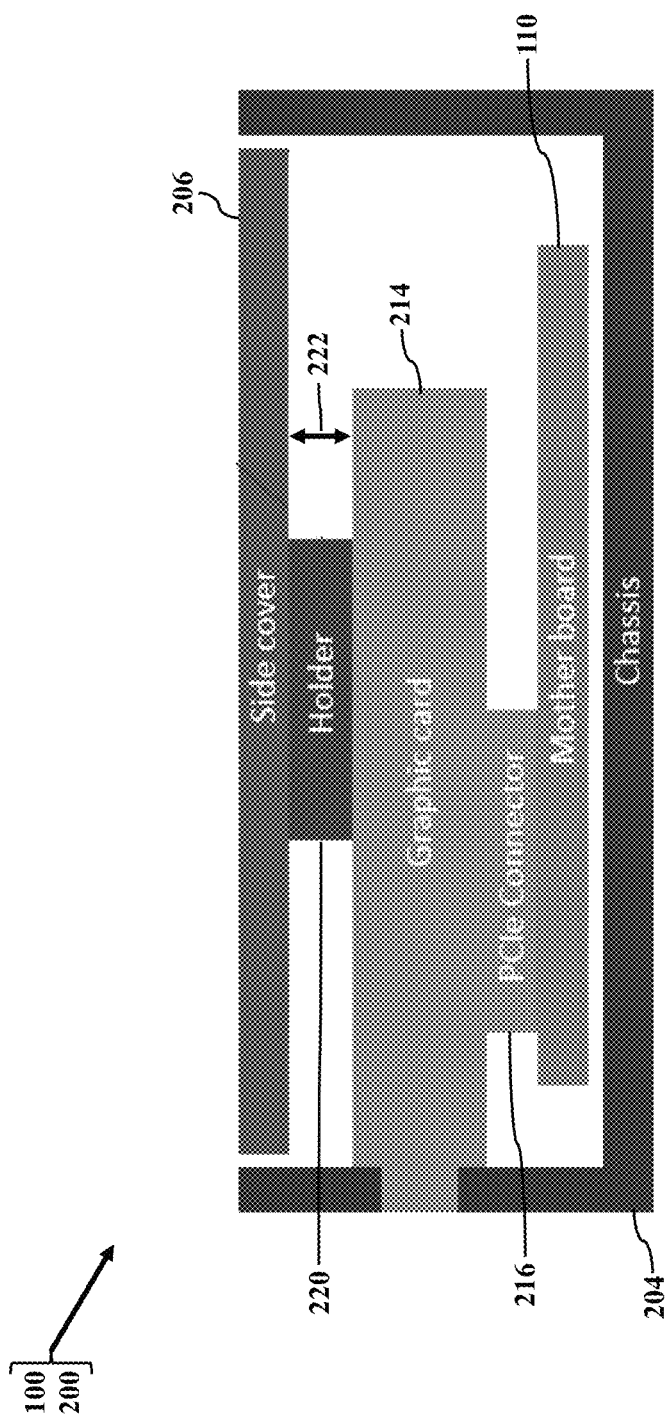
Figure 5:
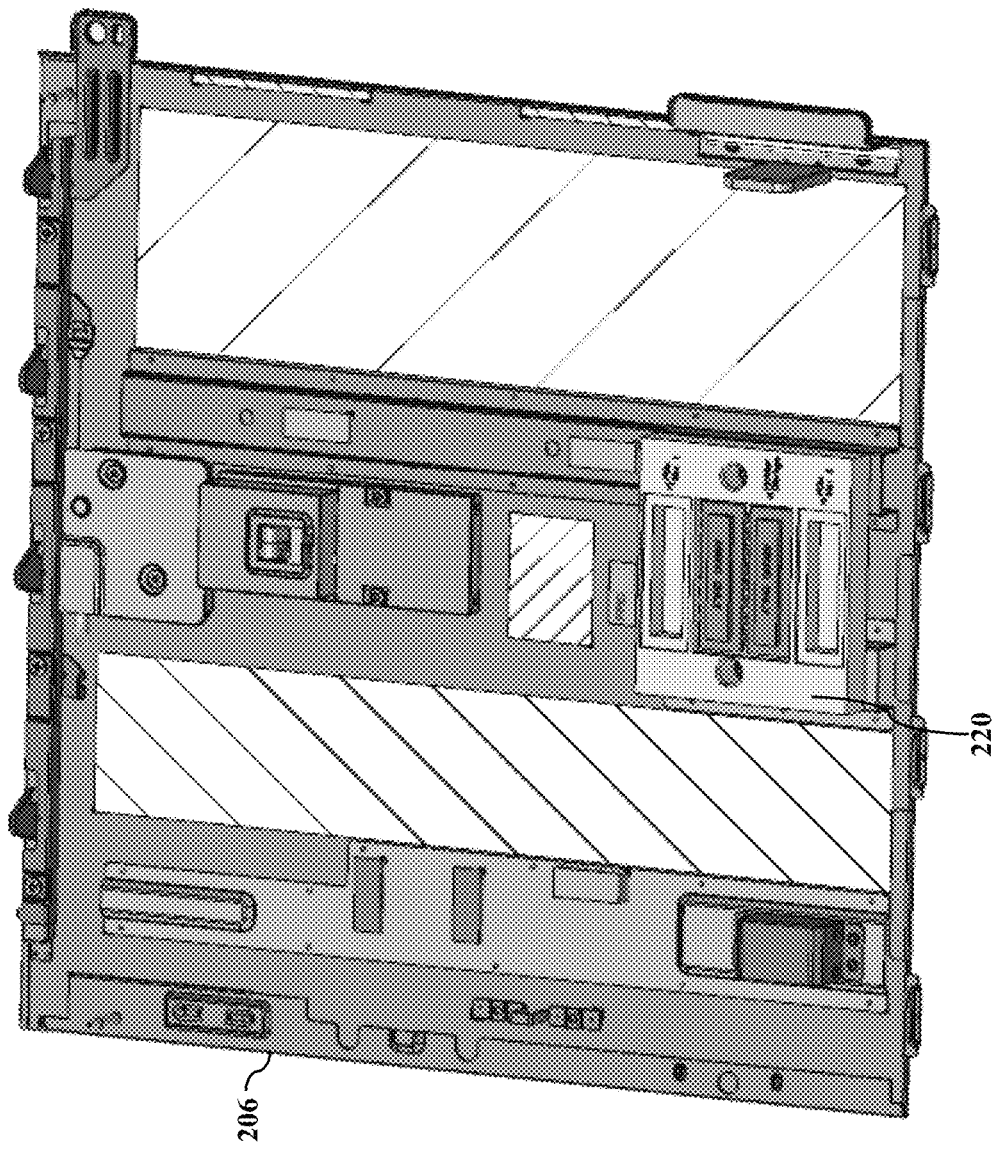

FIGS. 3-5 illustrate alignments of the holder module 220, according to exemplary embodiments. FIGS. 3-4 illustrate a general fitment and orientation of the holder module 220 to the graphics card 214 and to the side cover 206. FIG. 5 illustrates the holder module 220 oriented and installed to the side cover 206. FIG. 4, in particular, is a simplified, cutaway side view of the desktop computer 200. The graphics card 214 interfaces with a motherboard (such as the chipset 110) via the PCIe connector 216. The holder module 220 attaches to, or is secured to, the side cover 206. The holder module 220 has variable sizing and positioning to insert or sandwich between the side cover 206 and the graphics card 214. The holder module 220, for example, has swappable and orientable components that vary a thickness or depth dimension 222 between the side cover 206 and the graphics card 214. A human assembler, or a programmed robotic picker machine, assembles the holder module 220 according to the make/model/weight of the graphics card 214. Because the holder module 220 has the changeable or configurable thickness or depth dimension 222, the holder module 220 may accommodate a great variety of sizes/shapes/weights of different graphics cards 214. The variable thickness or depth dimension 222 thus ensures that the holder module 220 mechanically secures the graphics card 214. As the desktop computer 200 operates, the holder module 220 has a variable orientation and components that support, stabilize, and dampen the graphics card 214, regardless of the size/make/model/weight of the graphics card 214.

Figure 6:
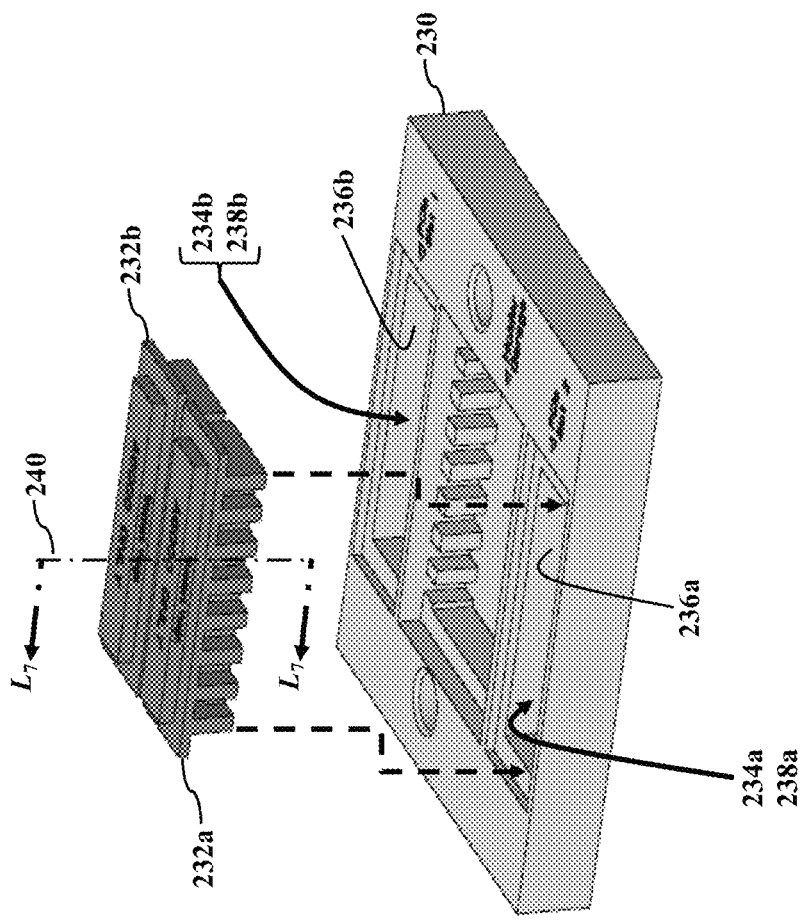
FIGS. 6-9 illustrate a general design and componentry of the holder module, according to exemplary embodiments.
Figure 7:
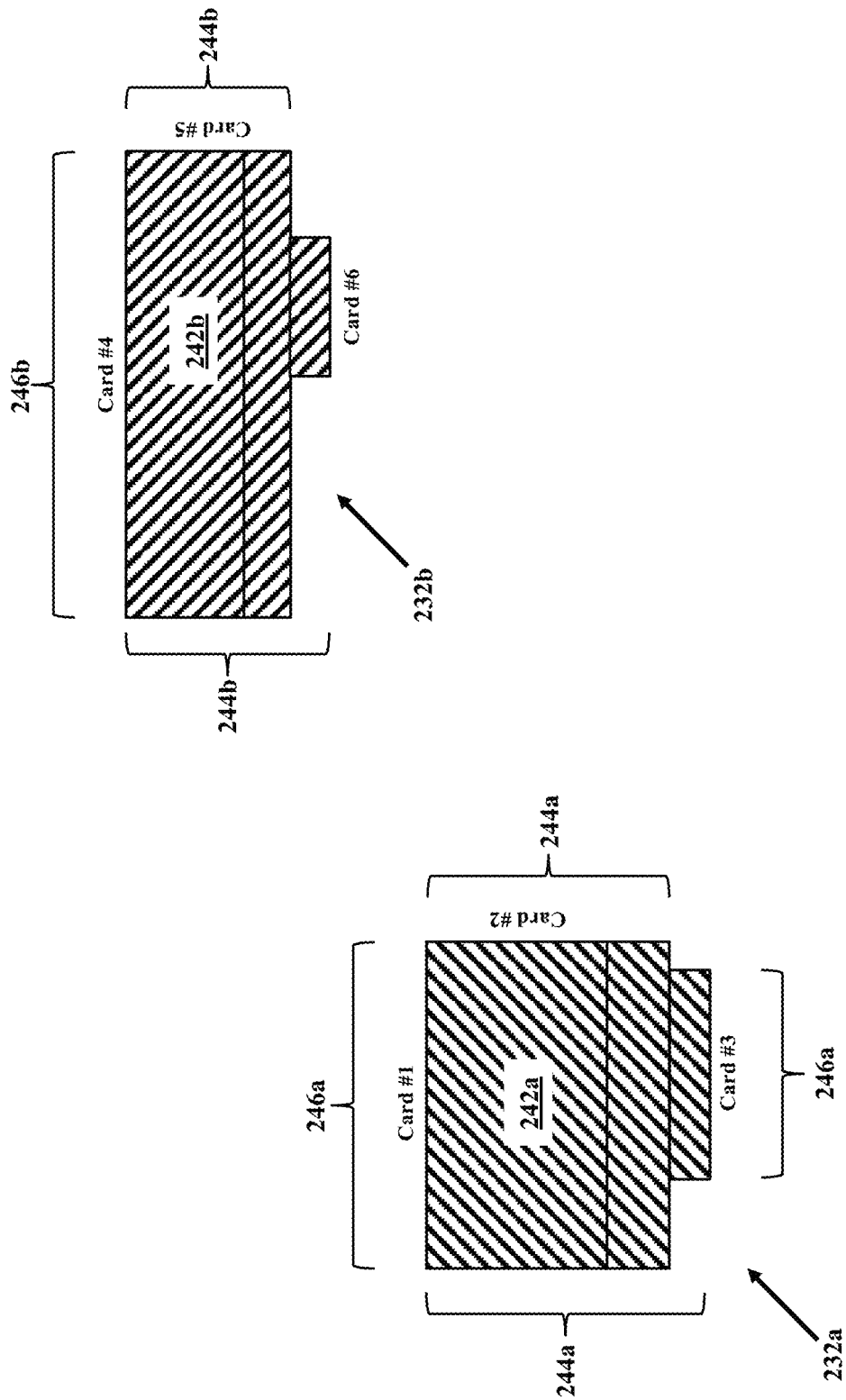
Figure 8:
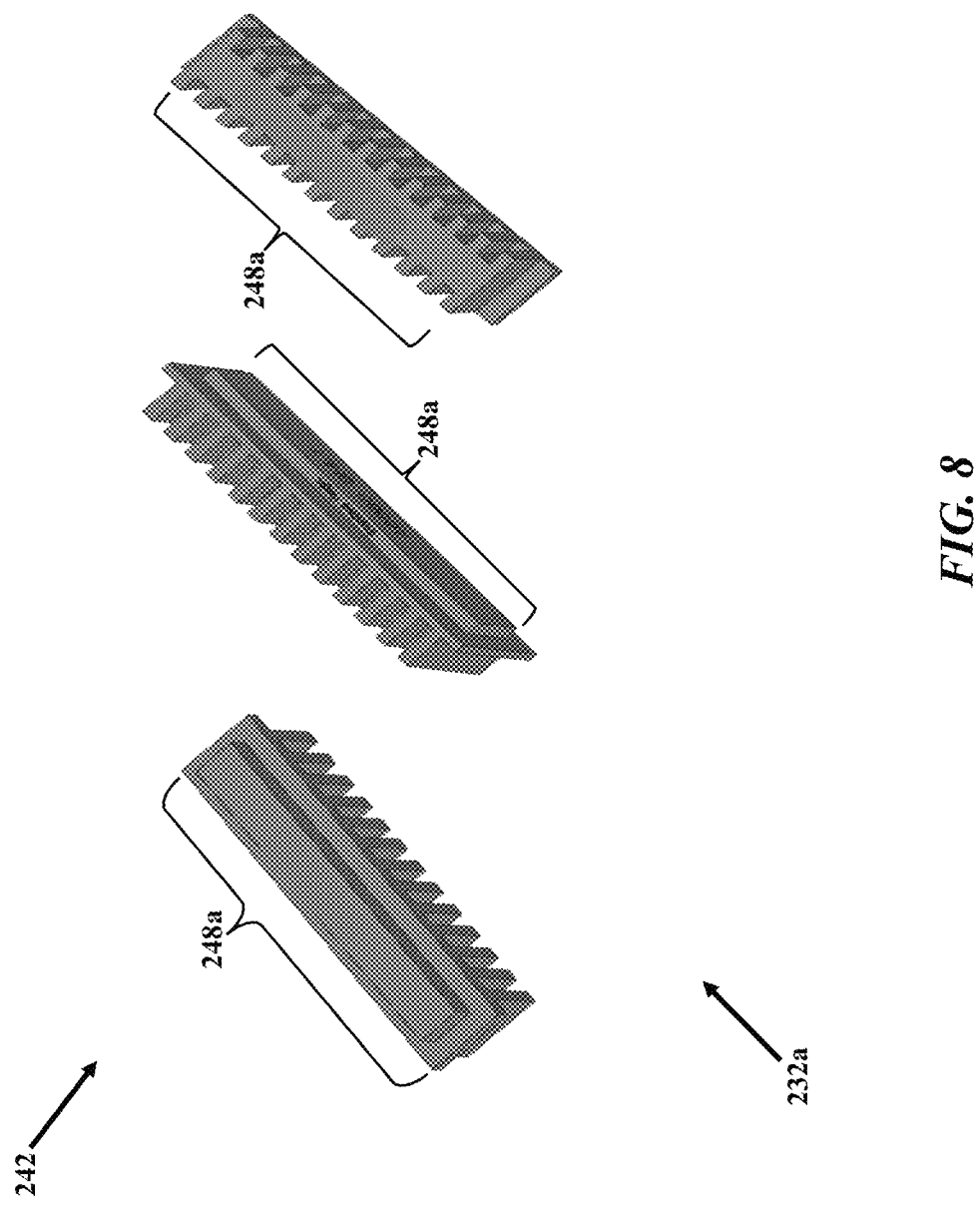
Figure 9:
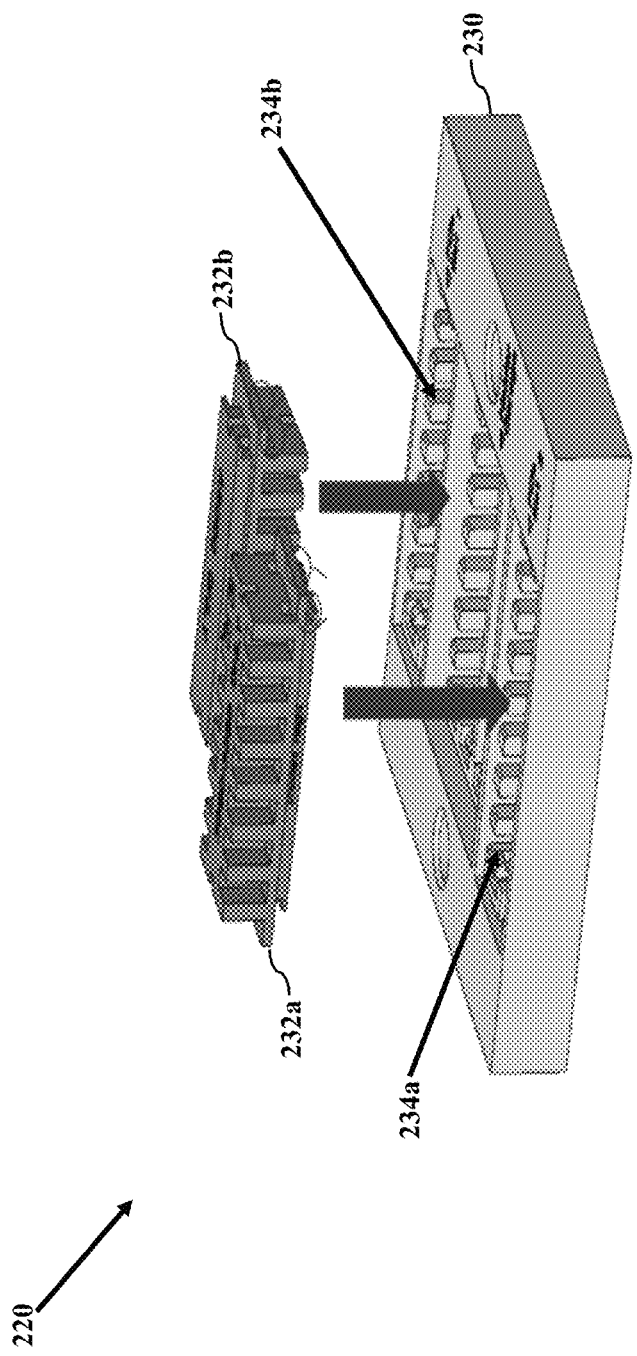

FIGS. 6-9 illustrate a general design and componentry of the holder module 220, according to exemplary embodiments. The holder module 220 is illustrated in a slightly enlarged view for clarity of its components and features. The holder module 220 has a base 230 that accepts interlocking, different-height card holders 232. While the base 230 may interface with any number or amount of the card holders 232, FIG. 6 illustrates a two-bay design. That is, the base 230 has a first tray 234a and a second tray 234b. Each tray 234a and 234b has a corresponding side wall 236a-b, a bottom surface 238a-b, and an open top. Each side wall 236 has a depth defining a cross-sectional area. Each card holder 232a-b inserts into the corresponding tray 234a-b. The first card holder 232a, for example, fits into the first tray 234a, while the second card holder 232b slides into the second tray 234b. FIG. 7 illustrates cross-sectional views of the card holders 232a and 232b taken along line $L_7$-$L_7$ (illustrated as reference numeral 240) in FIG. 6. As FIGS. 7-8 best show, each card holder 232 is generally manufactured as a rectangular brick 242 having different heights 244, widths/depths 246, and/or lengths 248, depending on its insertion orientation into the tray 234. Each card holder's height 244, width 246, and/or thickness/depth 248 accommodates a different make/model of the graphics card 214. As FIG. 9 best illustrates, then, each card holder 232a-b may be oriented and inserted into the corresponding tray 234a-b to snugly sandwich the holder module 220 between the side cover 206 and the graphics card 214 (as FIGS. 3-5 illustrate).

Exemplary embodiments thus present an elegant solution. There are many different manufacturers and models of the graphics card 214. There are many different sizes, and weights, of the graphics cards 214. Exemplary embodiments thus allow the holder module 220 to simply, quickly, and inexpensively adapt to any make/model/size/weight of the graphics card 214. A human or robotic picker need only choose, orient, and install the card holder 232 in a predetermined puzzle-like action. Indeed, as FIGS. 7-8 best illustrate, the first card holder 232a may have at least three (3) different orientations, with each orientation securing a different make/model/size/weight of the graphics card 214. Each different orientation changes the thickness or depth dimension 222 of the card module 220 between the side cover 206 and the graphics card 214 (as FIG. 4 illustrated). Each card holder 232, in other words, has multiple side facets or surfaces, and each surface corresponds to a different thickness or depth dimension 222 and thus to a different make/model/size/weight of the graphics card 214. A first side surface, for example, may be sized or dimensioned to insert into the first tray 234 and to accommodate the NVIDIA® GeForce RTX 3080 graphics card. A second side surface, however, may be sized to insert into the first tray 234 and to accommodate a standard-sized family of graphics cards. A third side surface, though, may be sized to accommodate the NVIDIA® RTX A6000 graphics card. The second card holder 232, similarly, may also have multiple and different orientations, with each side facet or surface securing still other graphics cards. The combined orientation of the base 230 and the card holder 232 (such as the thickness or depth dimension 222) may thus be predetermined for each make/model/size/weight of the graphics card 214. That is, once the make/model/size/weight of the graphics card 214 is known or determined (such as via an order or build sheet), a human user, or a programmed/automated machine picker, may quickly and easily orient the corresponding side surface and insert the card holder 232 into the tray 234. The card holder 232 thus snugly sandwiches the holder module 220 between the side cover 206 and the graphics card 214 (as FIGS. 3-5 illustrate). So, when the properly-oriented card holder 232 is inserted into the tray 234, the card holder 232 bears against, and mechanically secures, the graphics card 214.

Exemplary embodiments improve computer functioning. Testing and field use have shown that the PCIe connector 216 (best illustrated in FIG. 4) may crack and/or fail, due to the weight of the graphics card 214, general movements and use of the desktop computer 200, and vibratory motions from the cooling fan(s) 210. When the PCIe connector 216 fails, graphics functions are lost. Conventional solutions support the graphics card 214 using many different holders, with each conventional holder having a different sizing. Conventional solutions thus have many combinations/permutations that, when wrong, destroy the computer's primary function of graphical/visual output. Exemplary embodiments, instead, greatly reduce combinational complexity, thus greatly ensuring one of the computer's primary functions of graphical/visual output.

Exemplary embodiments also improve manufacturing. Because the conventional solutions use many different holders of many different heights, human/robotic pickers have many combinations/permutations that are easily confused, misplaced, and incorrectly installed. Inventory management and training are also cumbersome, complicated, and expensive. Exemplary embodiments, instead, present elegant designs that are simple to understand and simple to install. Human pickers/assemblers need only match the orientation of the card holder 232 to the corresponding graphics card 214. Component costs and complexity are reduced, and computer reliability is increased.

Figure 10:
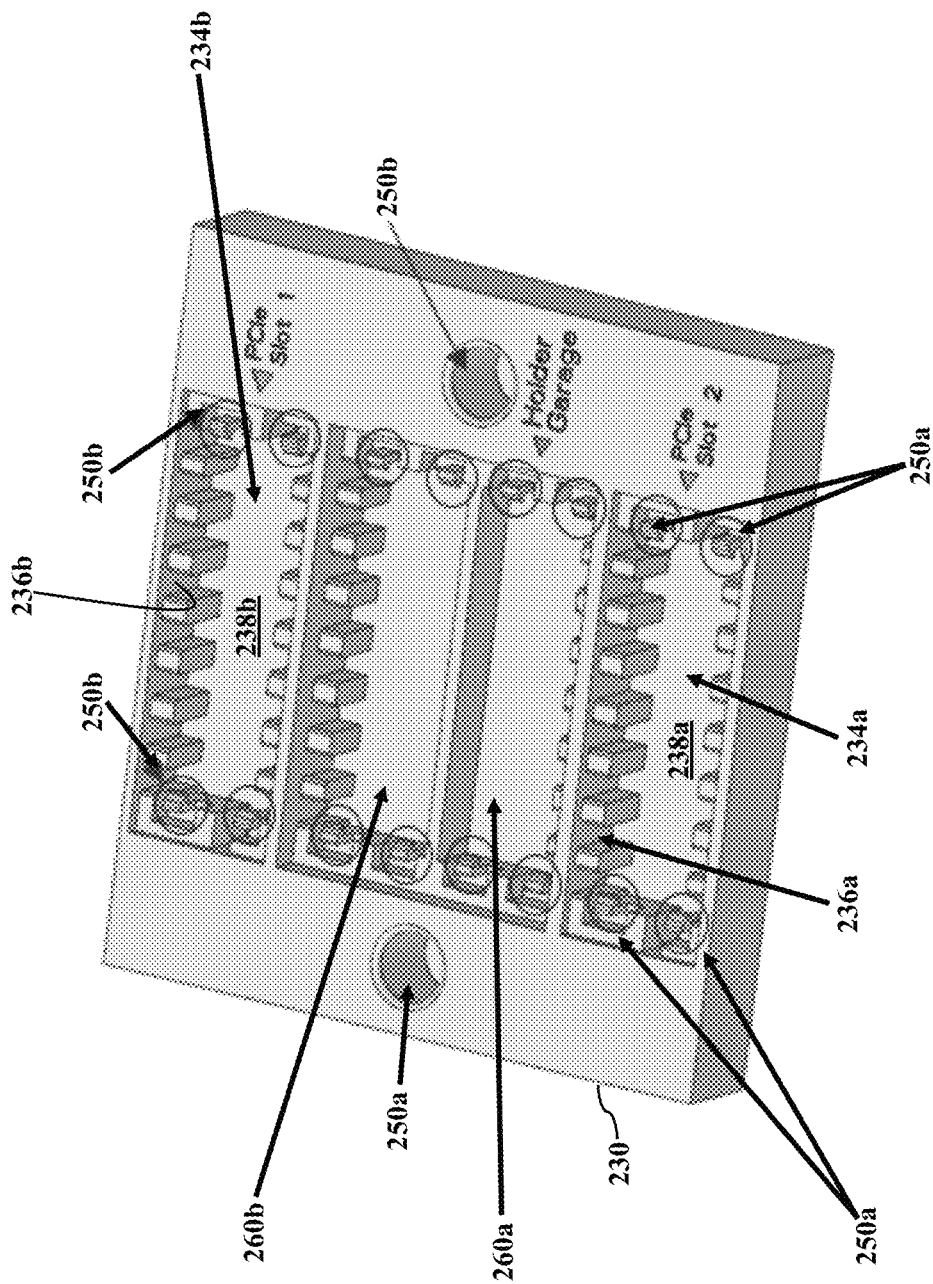
FIGS. 10-13 illustrate more details of the holder module, according to exemplary embodiments.
Figure 11:
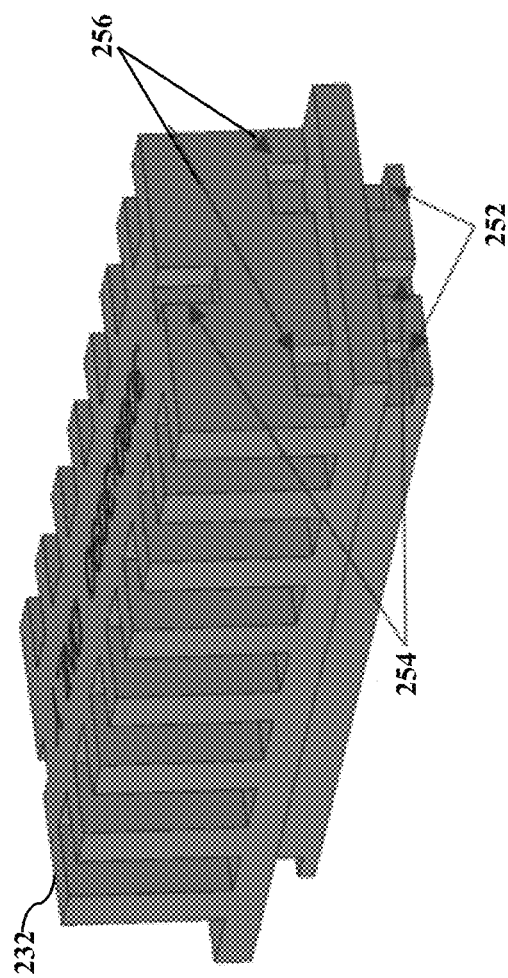

FIGS. 10-13 illustrate more details of the base 230 and of the card holder 232, according to exemplary embodiments. The base 230 secures to the side cover 206 (illustrated in FIGS. 2-5). While any means of securing the base 230 may be used, FIG. 10 illustrates mechanical fastment. That is, the base 230 has one or more through holes, passages, or bores 250a-b for screws, bolts, rivets, or other fasteners. The base 230, however, may snap-fit to the side cover 206 via any male/female, hook/latch, or other mechanical arrangement. The base 230 may also be adhesively adhered to the side cover 206. Whatever the means of securing the base 230 to the side cover 206, the base 230 is sized and located on the side cover 206 to generally mate with the installed expansion card 212 (such as the graphics card 214). Each tray 234 has its corresponding side wall 236, bottom surface 238, and open top.

Figure 12:
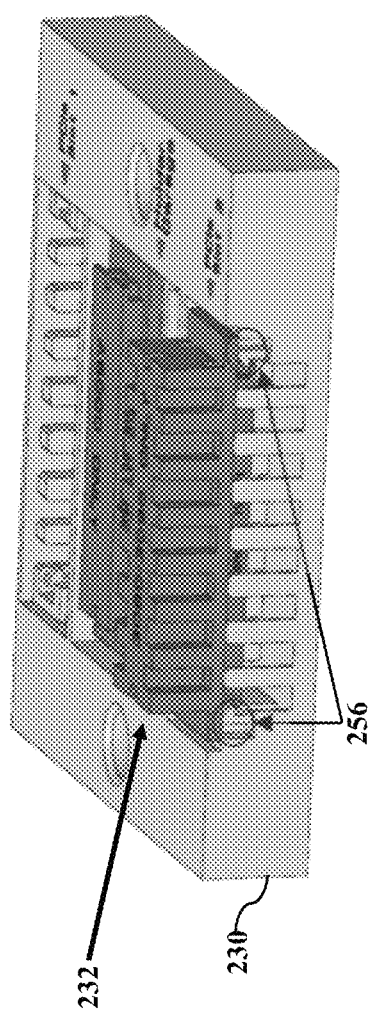
Figure 13:
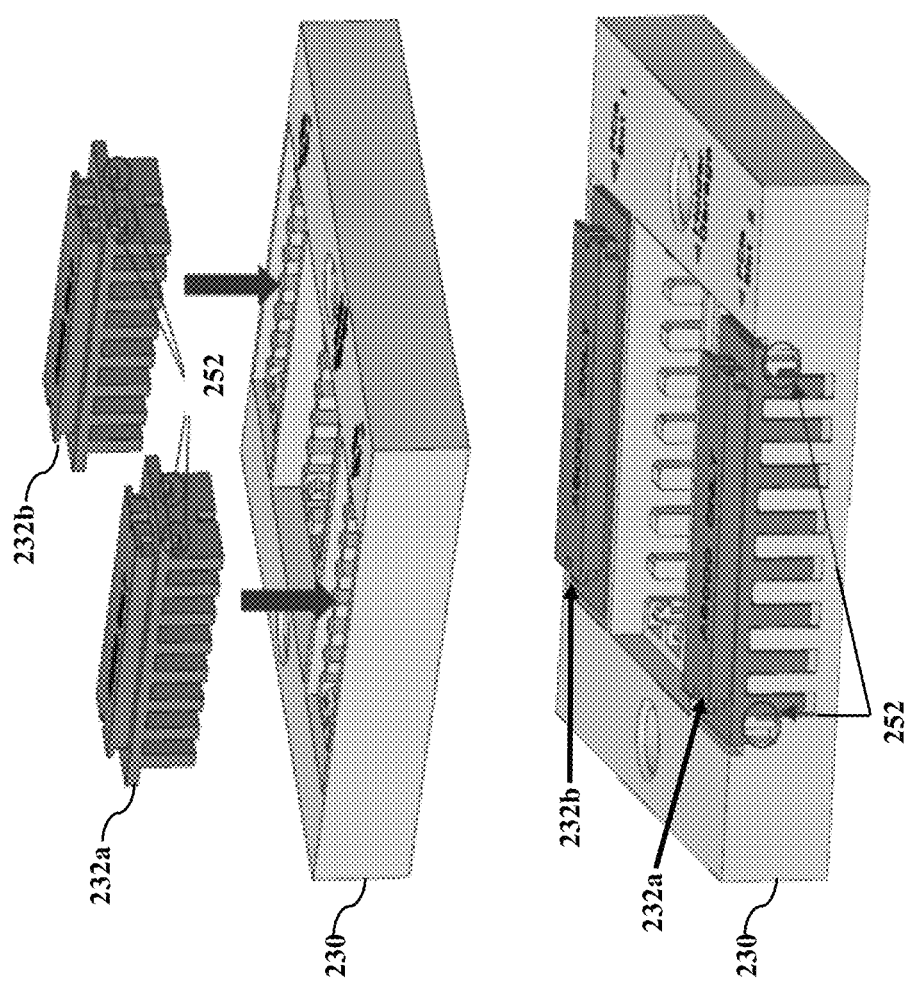

Each tray 234 may also include means for securing the card holder 232. Because the card holder 232 is pressed into the tray 234, the card holder 232 is preferably secured within the tray 234. Once the card holder 232 is installed, the card holder 232 is preferably secured to prevent falling out of the tray 234. The tray 234 may thus include means for securing the card holder 232. The card holder 232, for example, may be press- or interference-fit or glued in the tray 234. FIGS. 10-13, though, illustrate one or more pliable hooks that engage various notches in the card holder 232. Once the card holder 232 is oriented according to the graphics card 214, and placed into the tray 234, the protruding hooks engage corresponding notches in the card holder 232. The notches, in other words, may be sized and positioned according to a different make/model/size/weight of the graphics card 214. A first set 252 of notches, for example, may be sized, dimensioned, or positioned to latch into the card holder 232 when sandwiching/securing the NVIDIA® GeForce RTX 3080 graphics card (as cut-away portion of FIG. 13 illustrates). A second set 254 of notches, however, may be sized, dimensioned, or positioned to grab the card holder 232 when sandwiching/securing a standard-sized family of graphics cards. A third set 256 of notches is sized, dimensioned, or positioned to engage the card holder 232 when sandwiching/securing the NVIDIA® RTX A6000 graphics card (as cut-away portion of FIG. 12 illustrates). The sizing and placing of the hooks and notches may thus be predetermined for each make/model/size/weight of the graphics card 214. That is, once the make/model/size/weight of the graphics card 214 is known or determined (such as via an order or build sheet), a human user, or a programmed/automated machine picker, may quickly and easily snap the properly-oriented card holder 232 into the tray 234. The tray 234 thus secures the card holder 232 in its proper orientation to snugly sandwich the holder module 220 between the side cover 206 and the graphics card 214 (as FIGS. 3-5 illustrate).

FIG. 10 also illustrates auxiliary storage areas 260. The storage area 260 is a card holder garage for unused card holder(s) 232. The storage area 260 may be designed, sized, and molded into the base 230 to accommodate extra or unneeded card holders 232. Because there are a great many makes/models/sizes/weights of different graphics cards 214, there may be some installations or designs that only require a single card holder 232. That is, even though the holder module 220 may accommodate multiple card holders 232, the graphics card 214 may only need a single card holder 232. One (1) properly-oriented card holder 232, in other words, is sufficient to secure the graphics card 214 and to sandwich the holder module 220 between the graphics card 214 and the side cover 206. The storage area 260 may be molded or machined in the base 230 as one or more open-topped bays sized and positioned to accommodate at least one (1) spare or unused card holder 232. The storage area 260, though, may be positioned to not align with the expansion cards 212 (for example, the storage area 260 is misaligned to the graphics card 214). Even though the extra card holders 232 may be unnecessary, the base 230 may store extra card holders 232. The holder module 220, for example, may be prepackaged and shipped with multiple card holders 232. During an assembly operation, the human/machine picker thus need not discard or toss unneeded card holders 232. The picker, instead, may ignore the spare card holder 232 parked in the garage.

Figure 14:
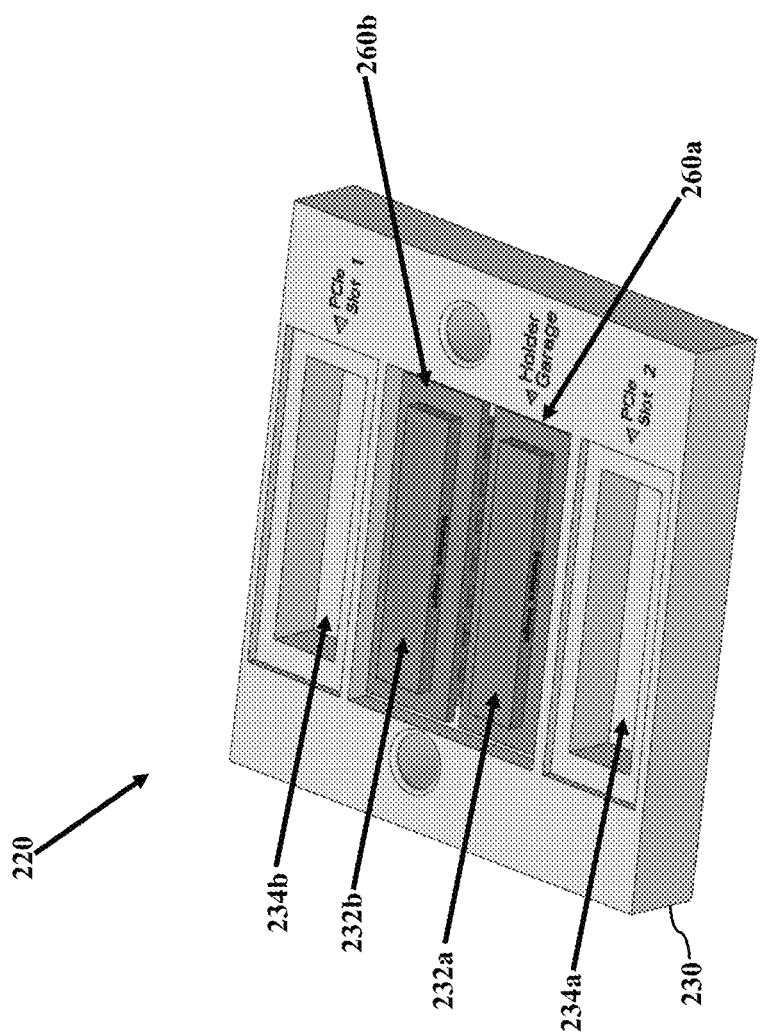
FIGS. 14-21 illustrate various configurations and orientation of the holder module, according to exemplary embodiments.
Figure 15:
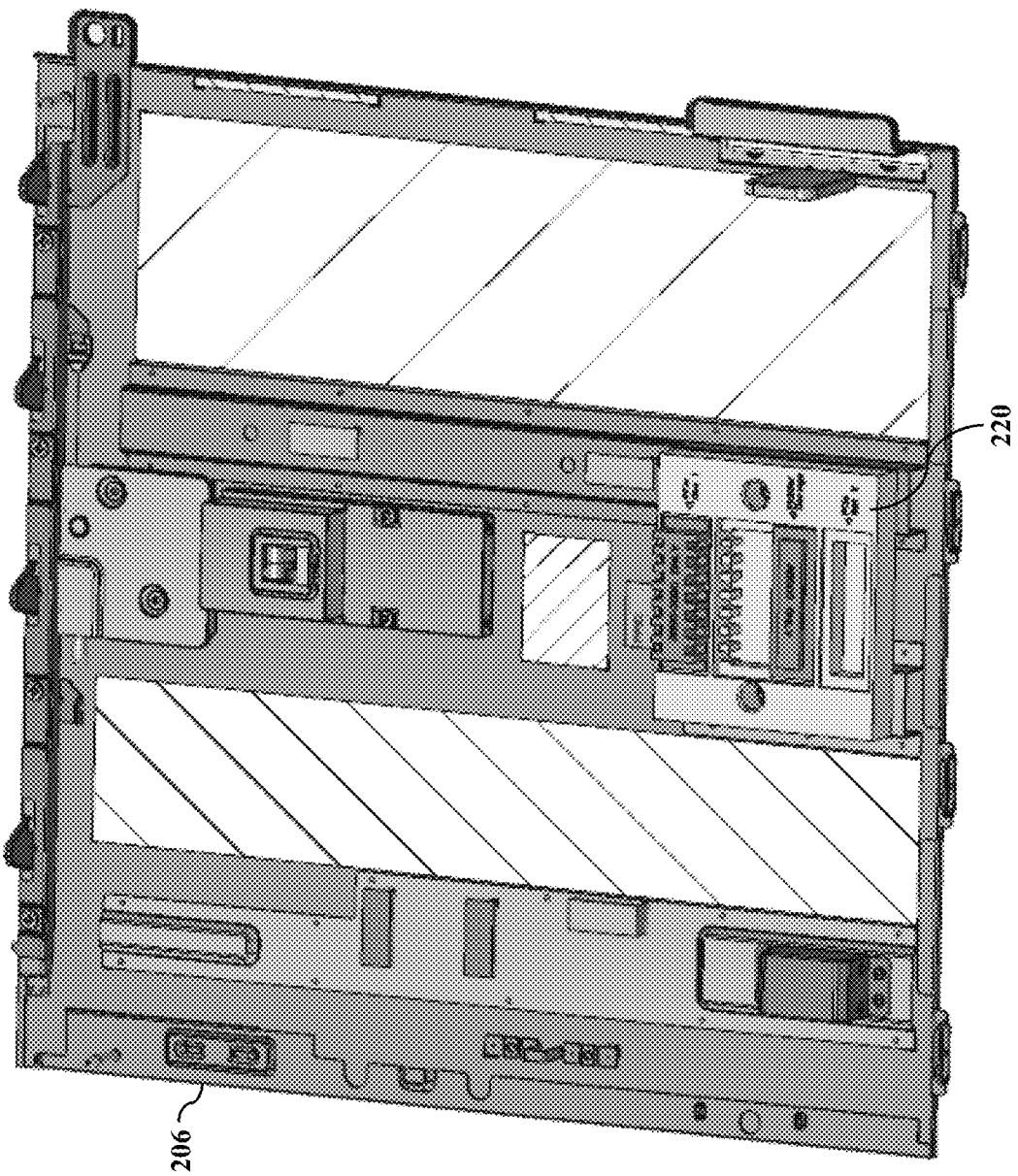
Figure 16:
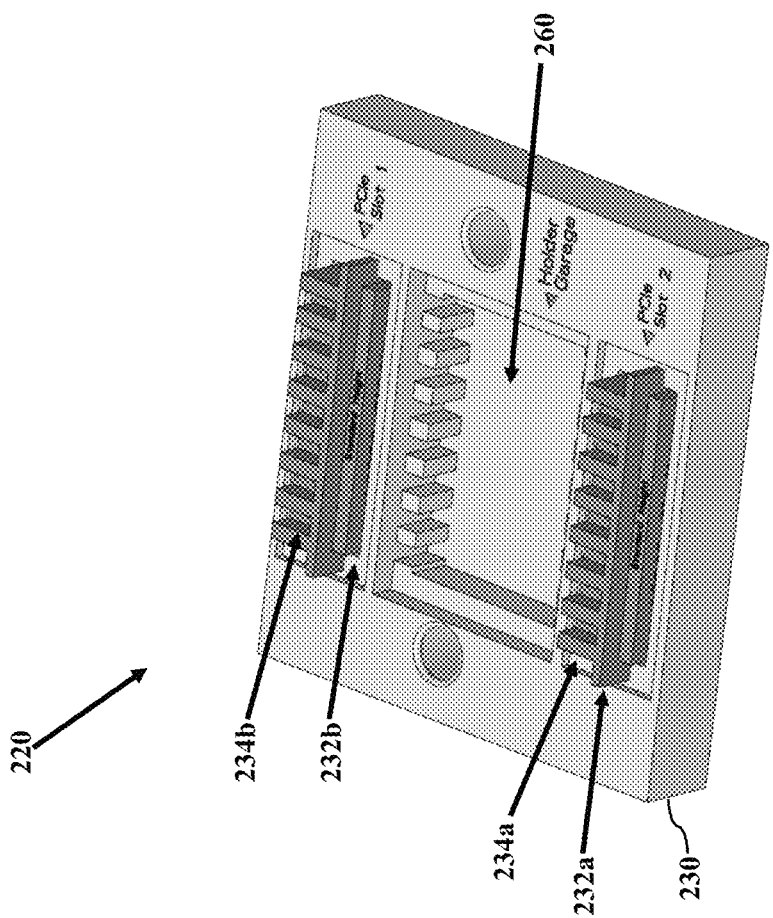
Figure 17:
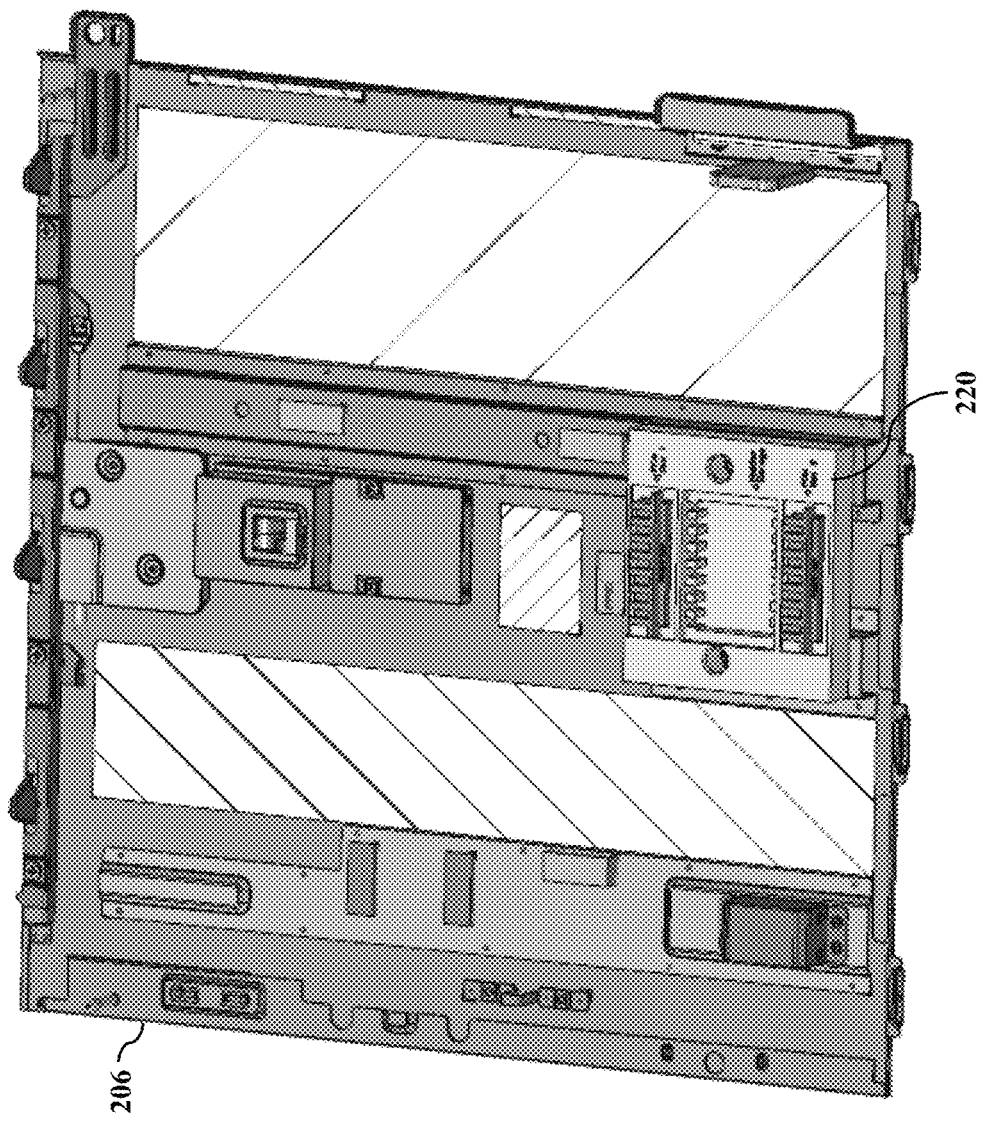
Figure 18:
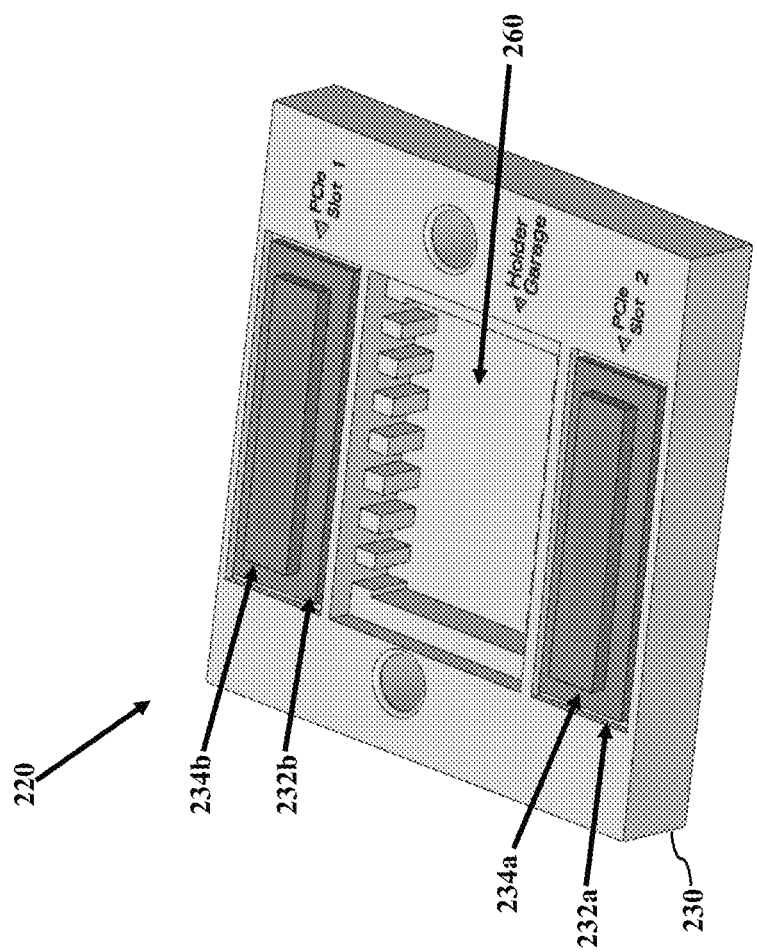
Figure 19:
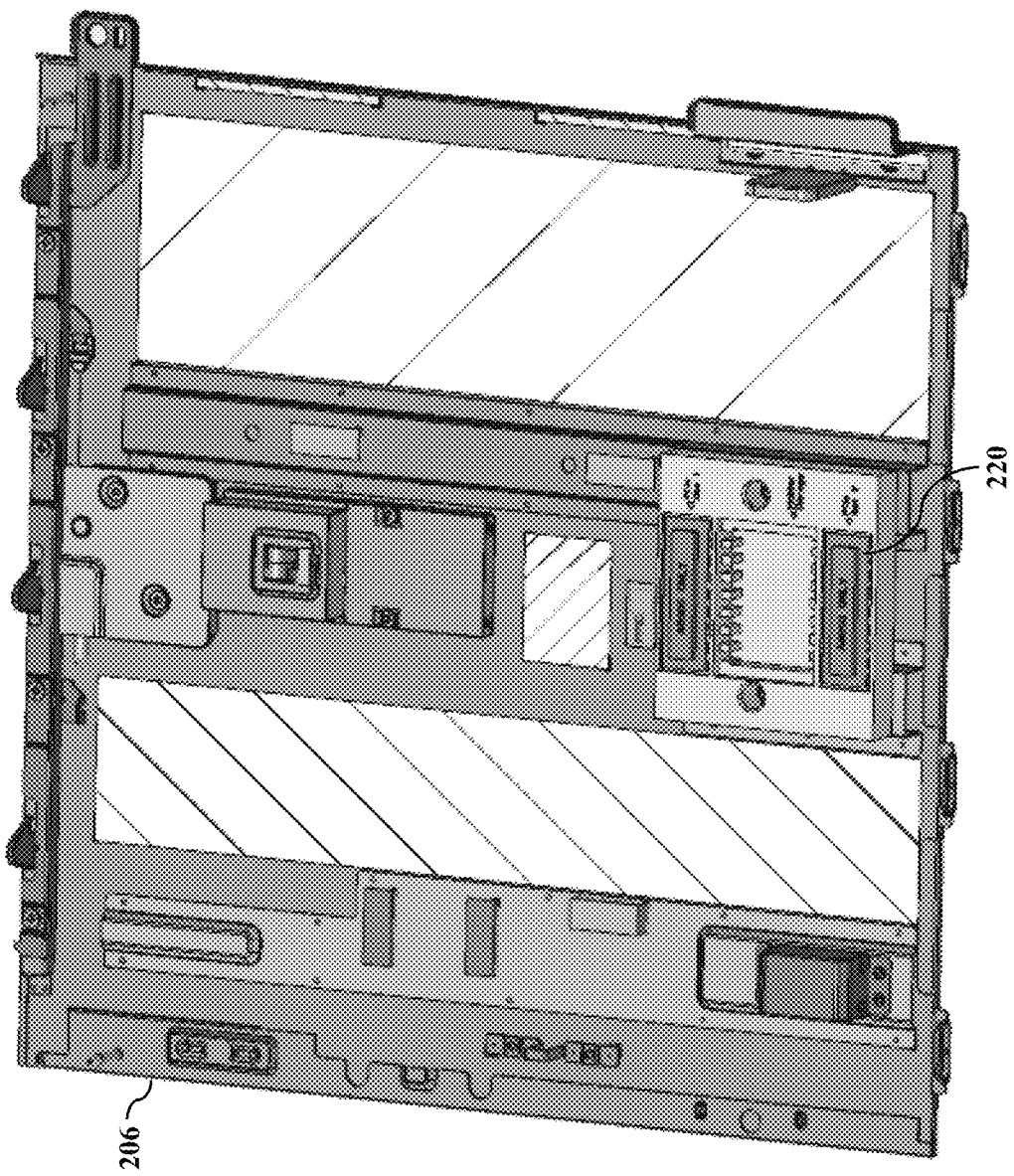
Figure 20:
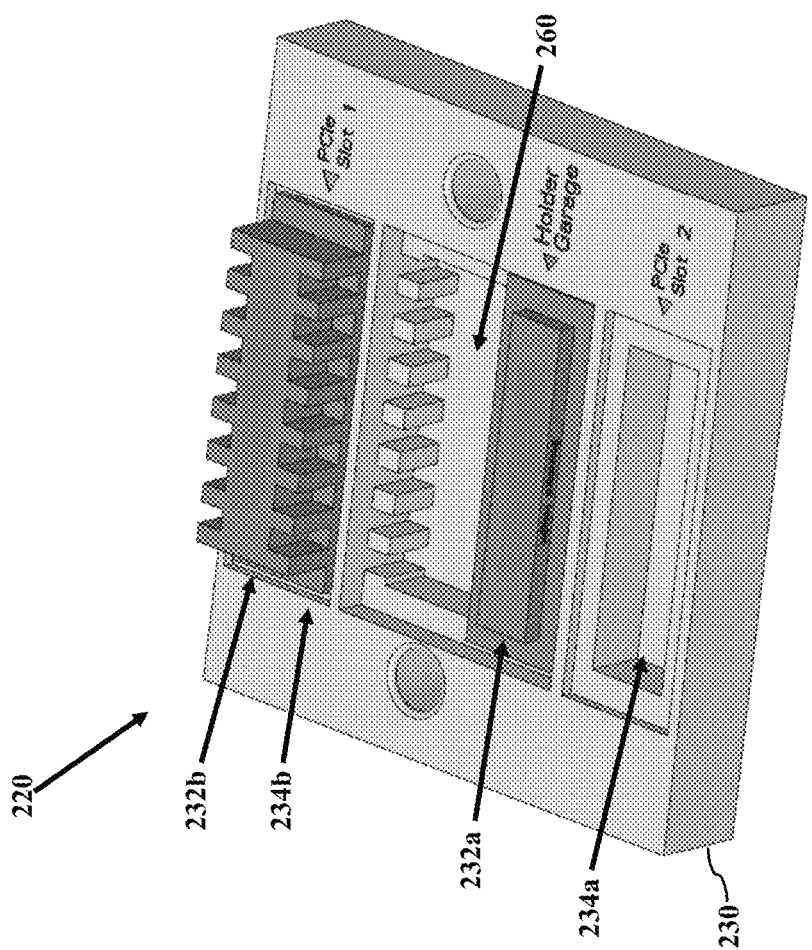
Figure 21:
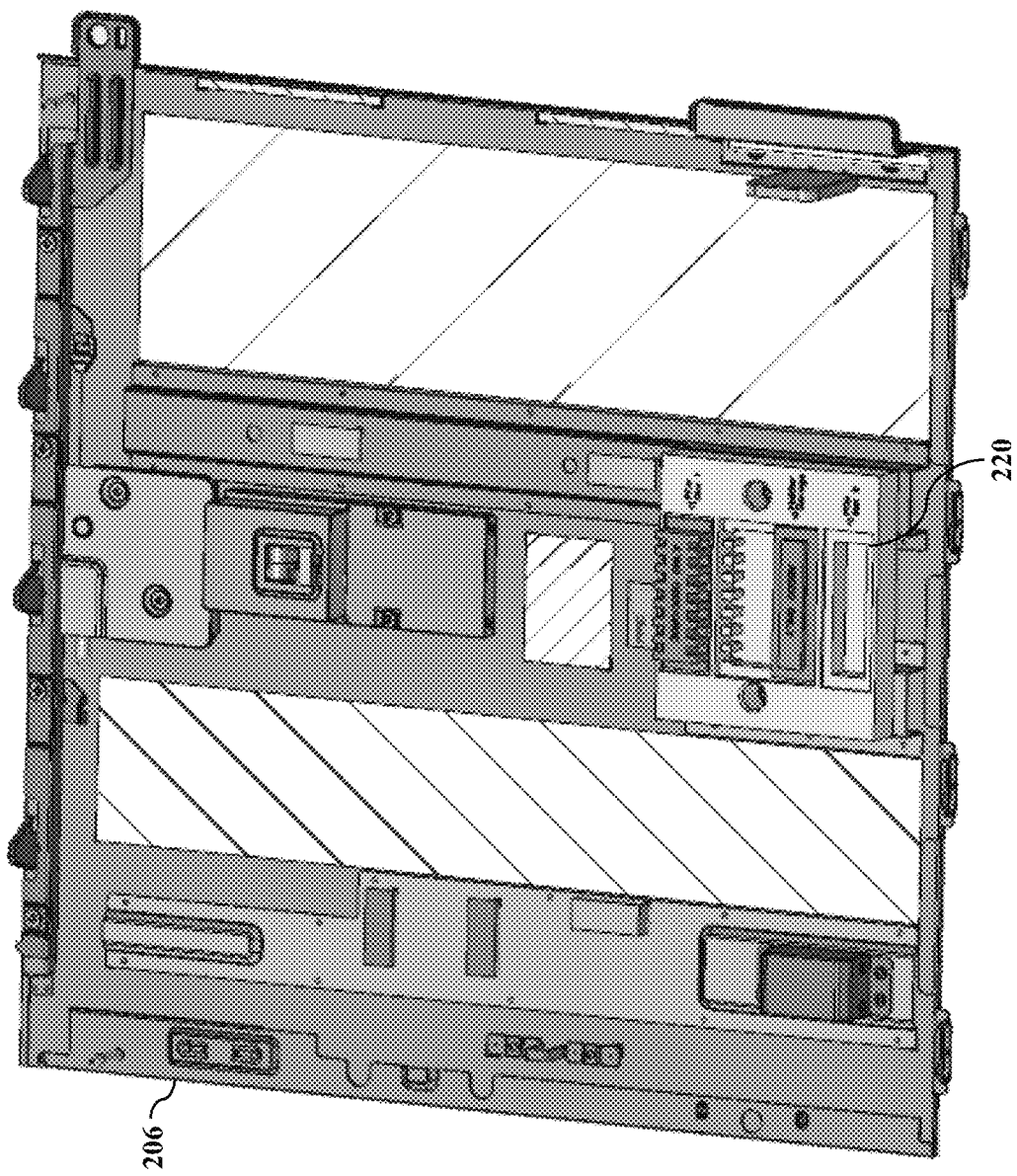

FIGS. 14-21 illustrate various configurations and orientation of the holder module 220, according to exemplary embodiments. FIGS. 14-15, for example, illustrate the holder module 220 prepackaged or shipped with the two (2) card holders 232a-b stowed in the storage area 260. FIGS. 16-17 illustrate the holder module 220 having the card holders 232a-b oriented and inserted into the trays 234a-b to secure/sandwich a standard-sized family of graphics cards. FIGS. 18-19 illustrate the holder module 220 having the card holders 232a-b oriented and inserted into the trays 234a-b to secure/sandwich the NVIDIA® RTX A6000 graphics card. FIGS. 20-21 illustrate the holder module 220 having the card holders 232a-b oriented and inserted into the trays 234a-b to secure/sandwich the NVIDIA® GeForce RTX 3080 graphics card. FIG. 21, in particular, illustrates how the NVIDIA® GeForce RTX 3080 graphics card only requires the single card holder 232b, so the spare card holder 232a remains stowed in the storage area 260.

Exemplary embodiments include any shape or design of the card holder 232 and/or the tray 234. Because the card holder 232 has multiple facets or surfaces, the cross-sectional shape of the card holder 232 may be a three-side triangle, a five-sided pentagon, a six-sided hexagon, a seven-sided heptagon, or any other multi-side cross-sectional shape. The multi-side cross-sectional shape has the different heights 244, widths/depths 246, and/or lengths 248 (as illustrated in FIG. 7), depending on its insertion orientation into the tray 234. The orientation of the card holder 232 corresponds to a different make/model of the graphics card 214.

Exemplary embodiments include many benefits. A computer manufacturing facility may use the same, single holder module 220, in the same location of the side cover 206, for all makes/models/configurations of expansion cards. The human/machine operator may easily adjust the single holder module 220 for all configurations of expansion cards. The storage area 260 eliminates discarding or removing parts for less operations, movement, and mental thought. The single holder module 220 mechanically supports many different expansion cards.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A holder module that secures a variety of expansion cards, the holder module comprising:
    a base having an open top tray; and
    a multi-sided card holder inserted into the open top tray,
        each side of the multi-sided card holder varying a depth dimension associated with the holder module, and the each side of the multi-sided card holder corresponding to a different expansion card of the expansion cards;

wherein the multi-sided card holder inserted into the open top tray varies the depth dimension associated with the holder module to secure the variety of the expansion cards.

2. The holder module of claim 1, wherein the base further comprises a second open top tray.

3. The holder module of claim 1, wherein the base further comprises multiple open top trays.

4. The holder module of claim 1, wherein the base further comprises an open top storage area sized to accept the multi-sided card holder.

5. The holder module of claim 1, wherein the base further comprises an open top storage area sized to accept multiple card holders.

6. The holder module of claim 1, further comprising means for securing the multi-sided card holder.

7. The holder module of claim 1, wherein the base further comprises means for securing the multi-sided card holder.

8. The holder module of claim 1, wherein the card holder further comprises means for securing the multi-sided card holder to the base.

9. The holder module of claim 1, wherein the base further comprises a fastener through hole.

10. The holder module of claim 1, further comprising a hook and notch that secures the multi-sided card holder in the tray.

11. The holder module of claim 1, further comprising a hook in the tray that engages a notch in the multi-sided card holder.

12. An information handling system, comprising:
an enclosure housing internal components including an expansion card; and
a holder module between a side cover of the enclosure and the expansion card, the holder module comprising:
a base secured to the side cover, the base having an open top tray; and
a multi-sided card holder inserted into the open top tray, each side of the multi-sided card holder varying a depth dimension between the side cover and the expansion card, and a side of the multi-sided card holder corresponding to the expansion card;
wherein the multi-sided card holder inserted into the open top tray varies the depth dimension to secure the expansion card.

13. The information handling system of claim 12, wherein the base further comprises a second open top tray.

14. The information handling system of claim 12, wherein the base further comprises multiple open top trays.

15. The information handling system of claim 12, wherein the base further comprises an open top storage area sized to accept the multi-sided card holder.

16. The information handling system of claim 12, wherein the base further comprises an open top storage area sized to accept multiple card holders.

17. The information handling system of claim 12, wherein the holder module further comprises means for securing the multi-sided card holder to the base.

18. The information handling system of claim 12, wherein the holder module further comprises a hook and notch that secures the multi-sided card holder in the tray.

19. The information handling system of claim 12, wherein the holder module further comprises a hook in the tray that engages a notch in the multi-sided card holder.

* * * * *